(12) United States Patent
Suzuki et al.

(10) Patent No.: US 10,934,624 B2
(45) Date of Patent: Mar. 2, 2021

(54) LAMINATED FILM

(71) Applicants: Tetra Laval Holdings & Finance S.A., Pully (CH); Keio University, Tokyo (JP)

(72) Inventors: Tetsuya Suzuki, Yokohama (JP); Yuya Futagami, Yokohama (JP); Akira Shirakura, Yokohama (JP); Kazuya Ono, Tokyo (JP)

(73) Assignees: Tetra Laval Holdings & Finance S.A., Fully (CH); Keio University, Tokyo (JP)

( * ) Notice: Subject to any disclaimer, the term of this patent is extended or adjusted under 35 U.S.C. 154(b) by 0 days.

(21) Appl. No.: 15/773,499

(22) PCT Filed: Nov. 4, 2016

(86) PCT No.: PCT/JP2016/082783
§ 371 (c)(1),
(2) Date: May 3, 2018

(87) PCT Pub. No.: WO2017/078133
PCT Pub. Date: May 11, 2017

(65) Prior Publication Data

US 2018/0320268 A1 Nov. 8, 2018

(30) Foreign Application Priority Data

Nov. 4, 2015 (JP) .............................. JP2015-217014

(51) Int. Cl.
*C23C 16/54* (2006.01)
*C23C 16/26* (2006.01)
(Continued)

(52) U.S. Cl.
CPC ............ *C23C 16/545* (2013.01); *C23C 16/26* (2013.01); *C23C 16/401* (2013.01); *C23C 16/50* (2013.01)

(58) Field of Classification Search
CPC ..... C23C 16/545; C23C 16/50; C23C 16/401; C23C 16/26; B32B 17/06
See application file for complete search history.

(56) References Cited

U.S. PATENT DOCUMENTS 6,027,793 A * 2/2000 Lohwasser ................. C08J 7/06
428/215
8,846,187 B2 9/2014 Fukuda
(Continued)

FOREIGN PATENT DOCUMENTS

EP 2123446 11/2009
JP 09 272567 10/1997
(Continued)

OTHER PUBLICATIONS

EspacenetTranslation of WO-2010100971-A1 via JP5780154 (JP Equivalent) (Year: 2019).*
(Continued)

*Primary Examiner* — Michael Zhang
(74) *Attorney, Agent, or Firm* — Finnegan, Henderson, Farabow, Garrett & Dunner, LLP

(57) ABSTRACT

The aim of the present invention lies in inexpensively providing a thin-film laminated film having excellent barrier properties. A further aim of the present invention lies in providing a method for producing a thin-film laminated film in which a plurality of thin films are coated on a plastic film by means of atmospheric-pressure plasma CVD which has low equipment costs and running costs, and also in providing a thin-film laminated film production apparatus which is able to operate continuously for a long period of time and can produce high-speed coating. A thin film according to the
(Continued)

present invention includes a plastic film, a first silicon oxide-based thin film containing silicon oxide as the main component, and a first amorphous carbon-based thin film. The first amorphous carbon-based thin film is formed on the first silicon oxide-based thin film. The first silicon oxide-based thin film has pinholes with a diameter in the range of 10-200 nm.

5 Claims, 7 Drawing Sheets

(51) Int. Cl.
  *C23C 16/40* (2006.01)
  *C23C 16/50* (2006.01)

(56) References Cited

U.S. PATENT DOCUMENTS

| | | | |
|---|---|---|---|
| 2004/0146667 A1* | 7/2004 | Hama | C23C 16/045 428/34.1 |
| 2004/0161534 A1 | 8/2004 | Saito et al. | |
| 2007/0031674 A1* | 2/2007 | Tolt | H01L 51/524 428/411.1 |
| 2010/0003482 A1* | 1/2010 | Fukuda | C23C 16/30 428/218 |

FOREIGN PATENT DOCUMENTS

| | | | |
|---|---|---|---|
| JP | 11245327 A | * | 9/1999 |
| JP | H11 245327 | | 9/1999 |
| JP | H11 348171 | | 12/1999 |
| JP | 2002 151507 | | 5/2002 |
| JP | 2003 171770 | | 6/2003 |
| JP | 2005088452 A | * | 4/2005 |
| JP | 2008 094447 | | 4/2008 |
| JP | A 2009-161782 | | 7/2009 |
| JP | 2010 208277 | | 9/2010 |
| JP | 2014 065281 | | 4/2014 |
| WO | WO 2008-096617 | | 8/2008 |
| WO | WO-2010100971 A1 | * | 9/2010 ............... B32B 7/02 |

OTHER PUBLICATIONS

Ladwig, A. M., Koch, R. D., Wenski, E. G., & Hicks, R. F. (2009). Atmospheric plasma deposition of diamond-like carbon coatings. Diamond and Related Materials, 18(9), 1129-1133. (Year: 2009).*
Espacenet Translation of JP-2005088452-A (Year: 2019).*
Espacenet Translation of JP-11245327-A (Year: 2019).*
Office Action in corresponding Japanese Application 2015-217014 dated Aug. 7, 2018 (6 pages).
International Search Report from corresponding PCT Application No. PCT/JP2016/082783 dated Mar. 31, 2017 (5 pages).
Inagaki, Tasaka, and Hiramatu, Journal of Applied Polymer Science, vol. 71,2091-2100 (1999).
Ahmet G. Erlat et al., *SiOx Gas Barrier Coatings on Polymer Substrates: Morphology and Gas Transport Considerations*, 103 J. Phys. Chem. B 6047 (1999) (9 pages).

\* cited by examiner

[Fig. 1]
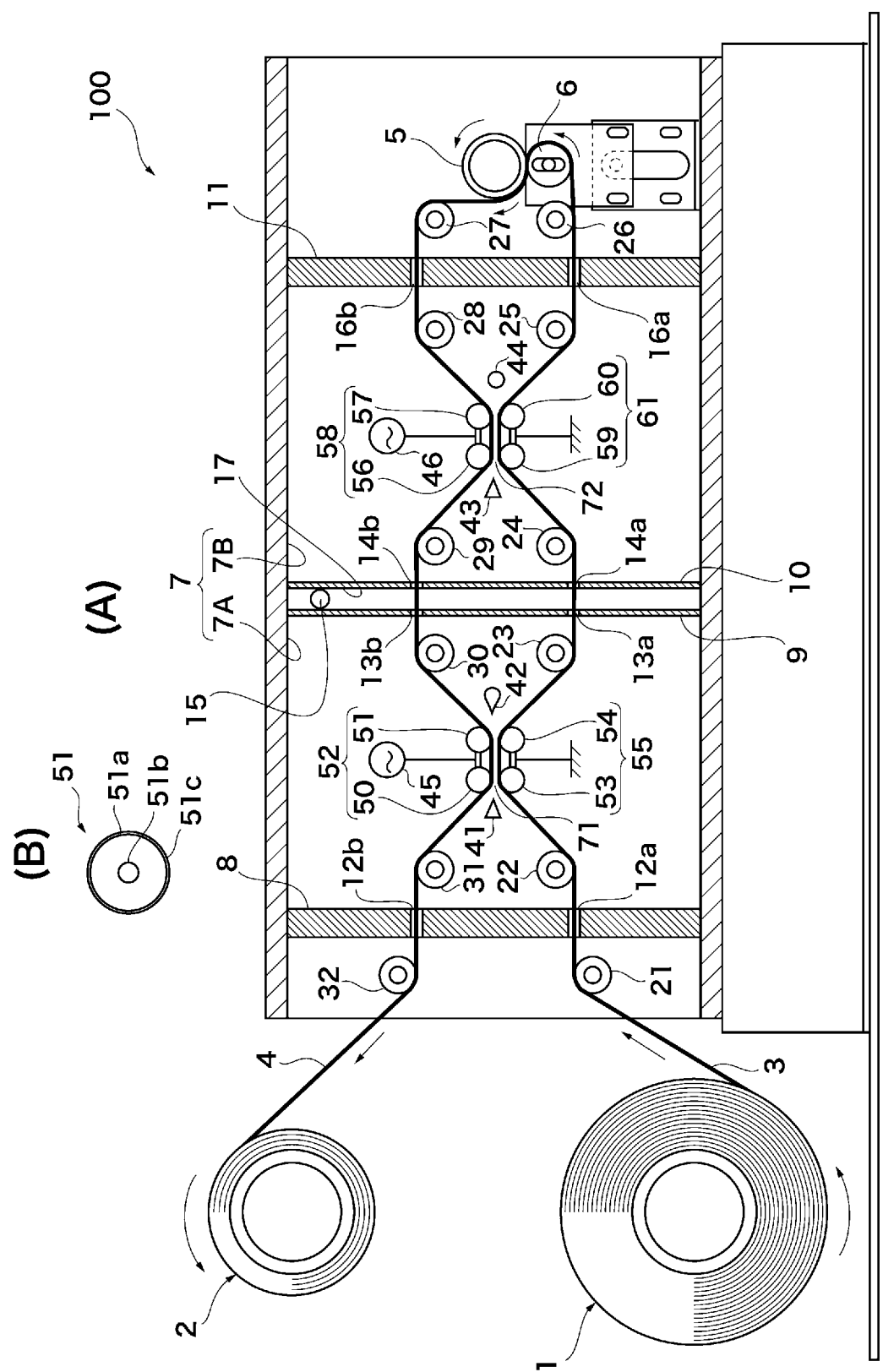

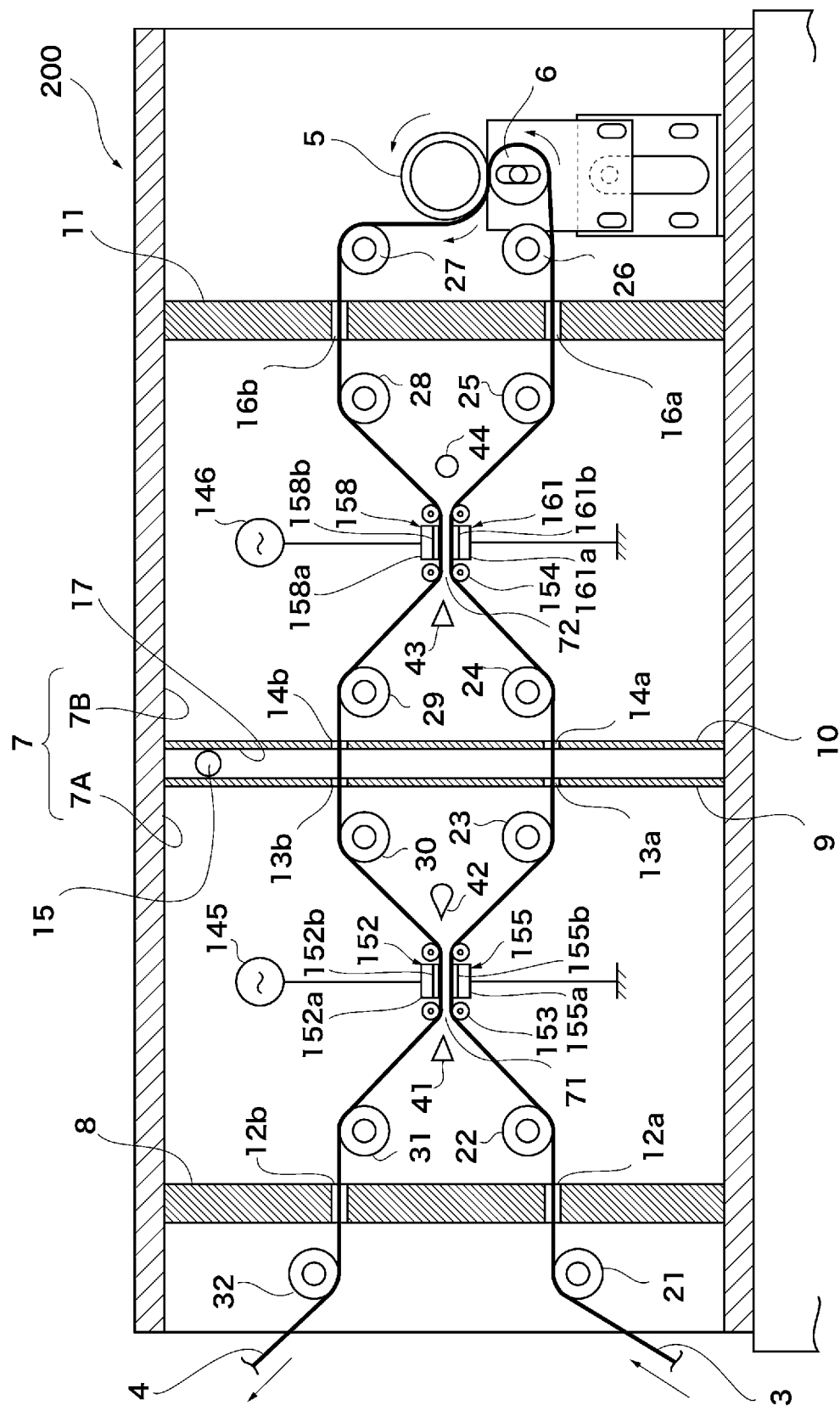
[Fig. 2]

[Fig. 3]
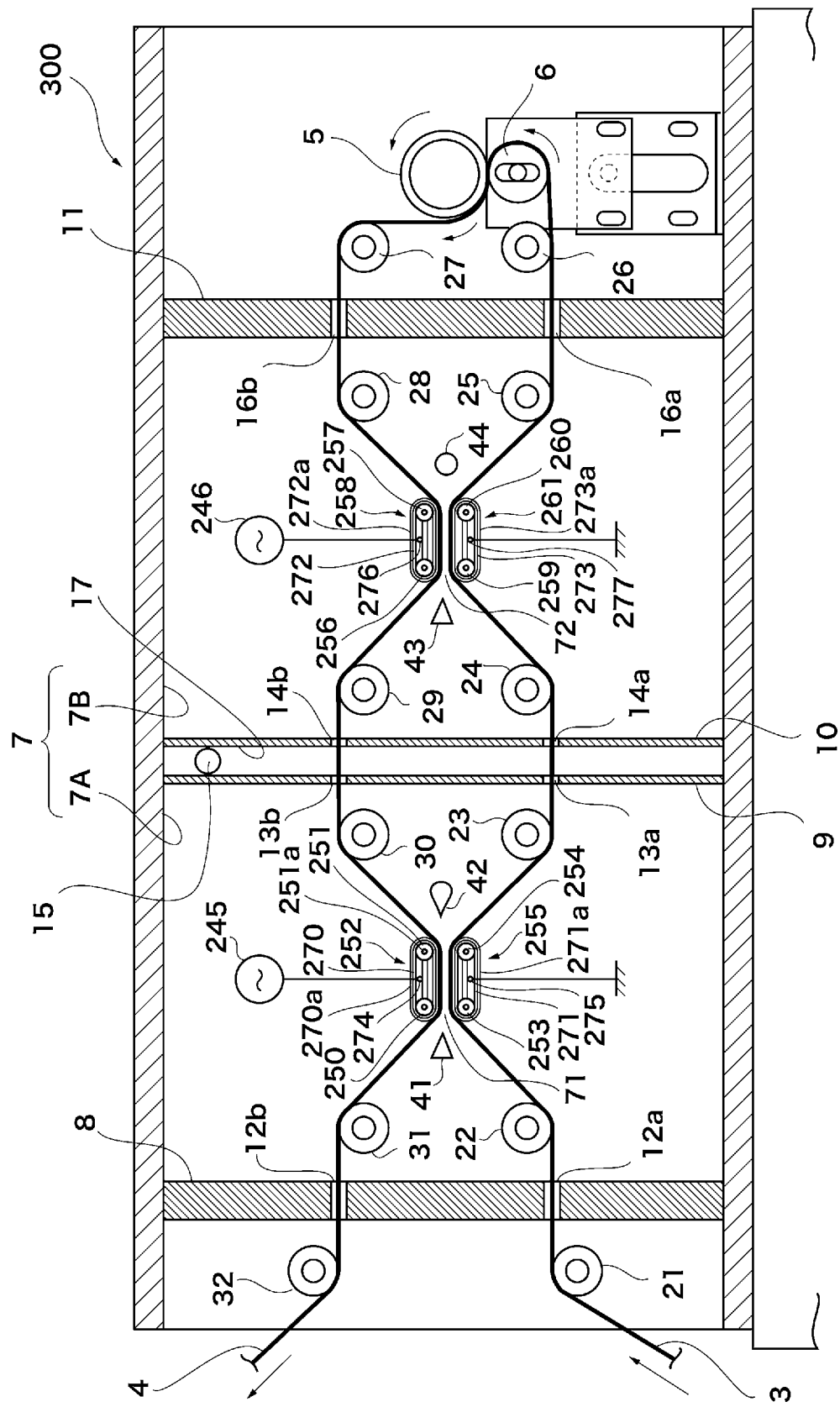

[Fig. 4]
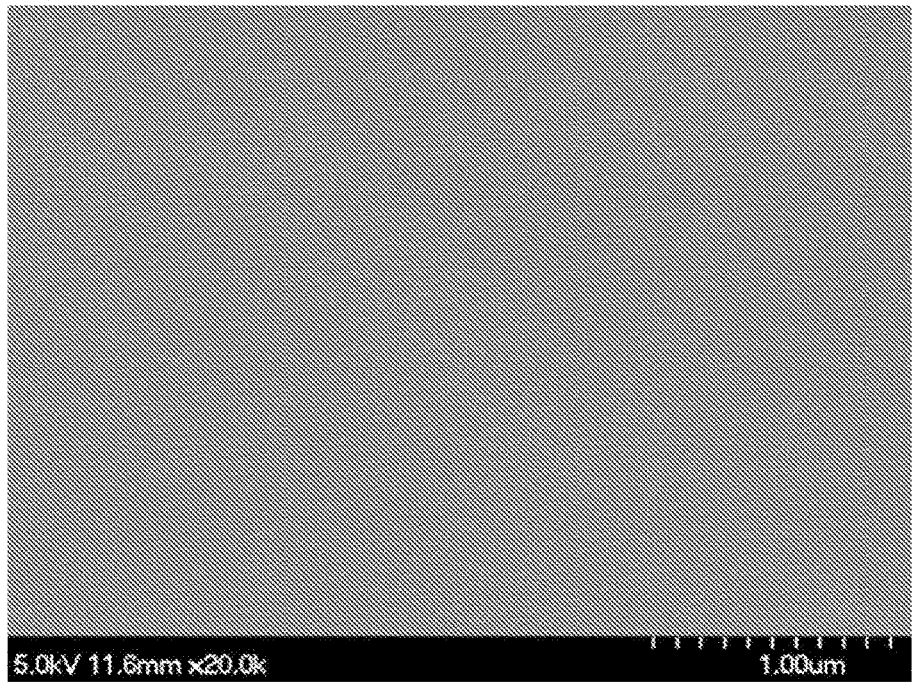
[Fig. 5]
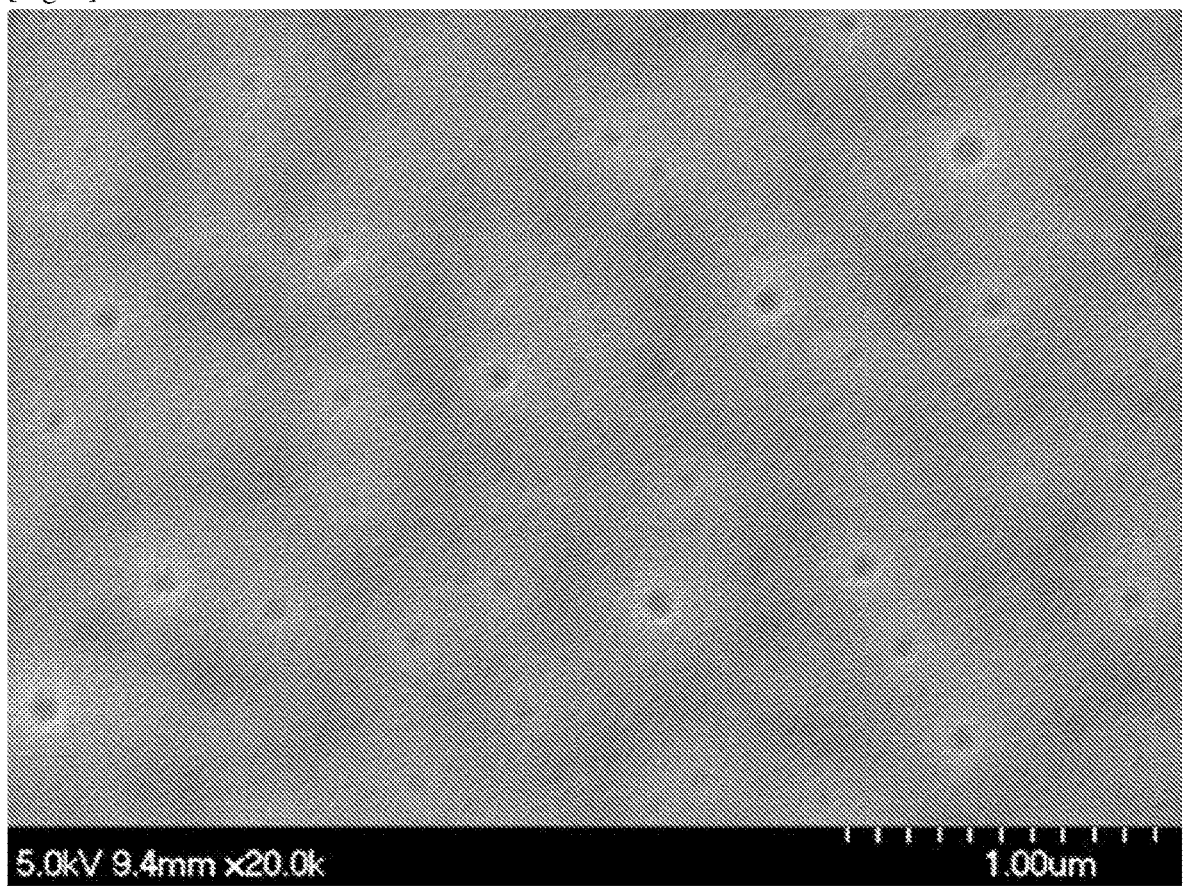

[Fig. 6]
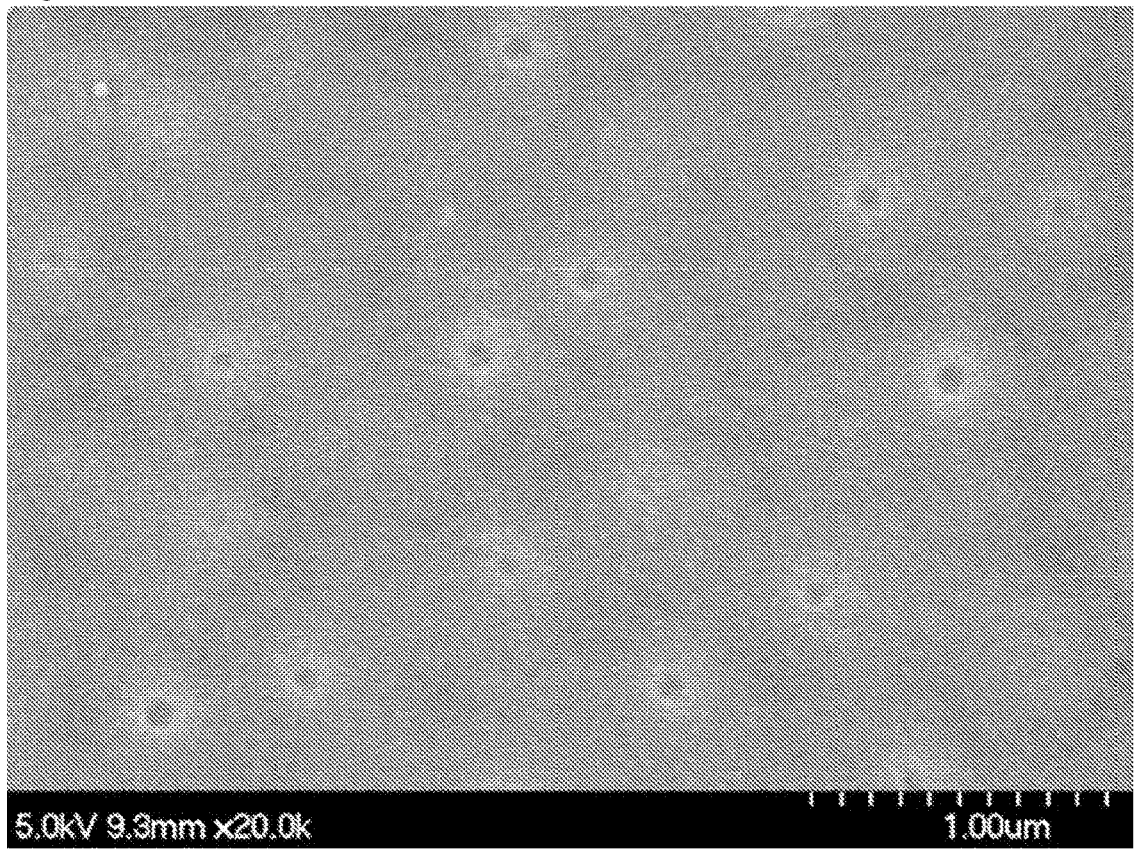
[Fig. 7]
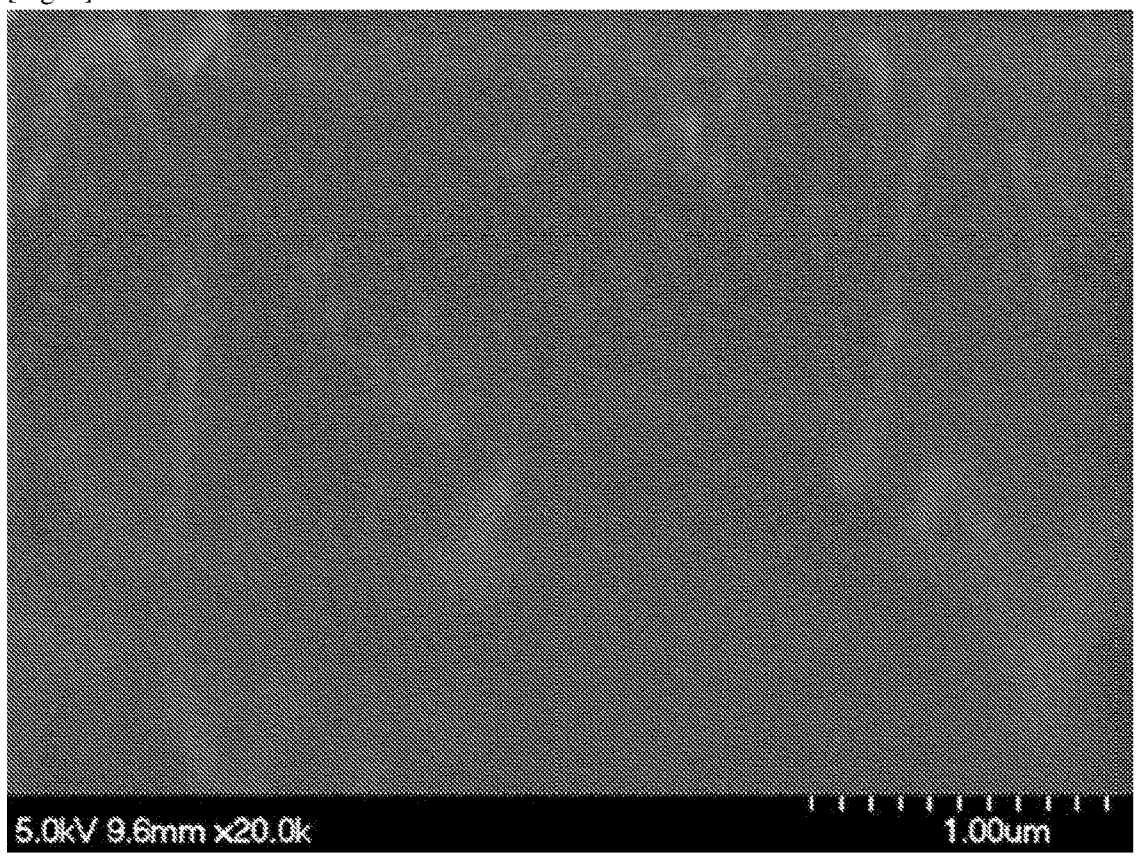

[Fig. 8]
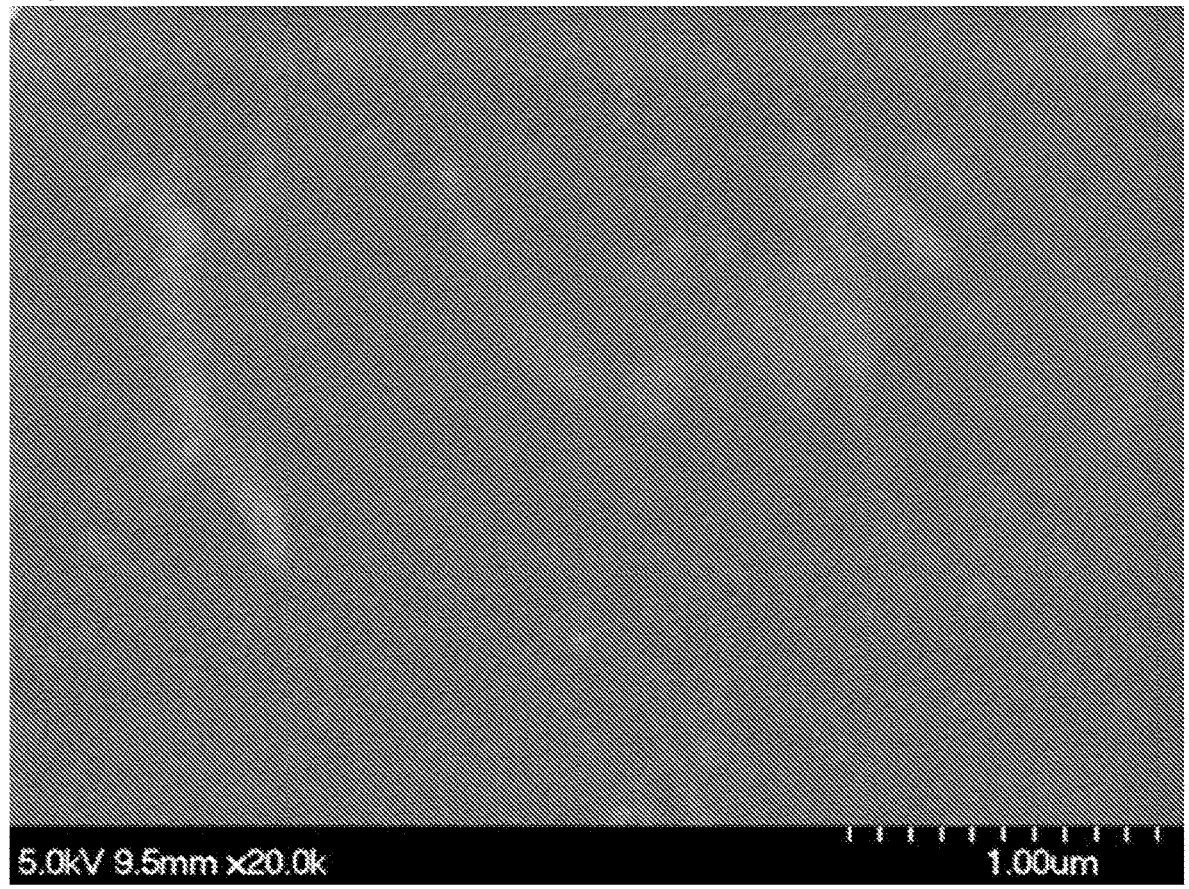
[Fig. 9]
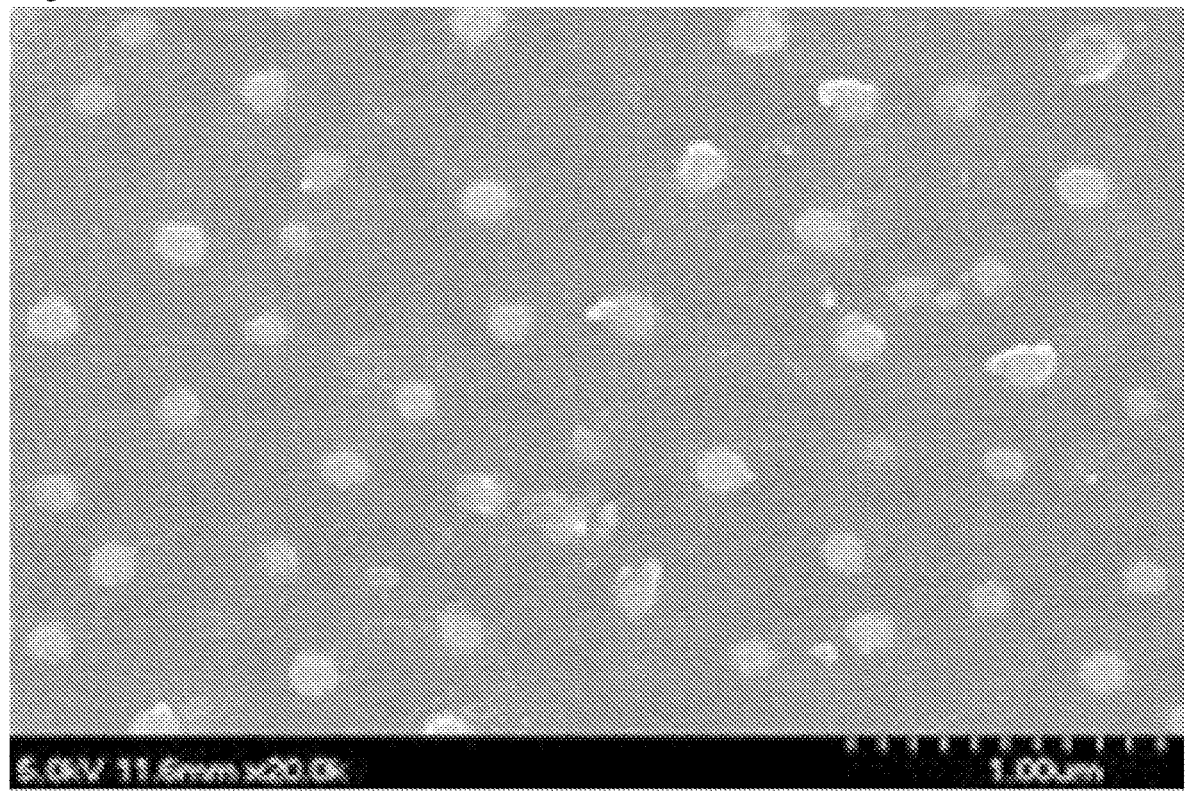

[Fig. 10]
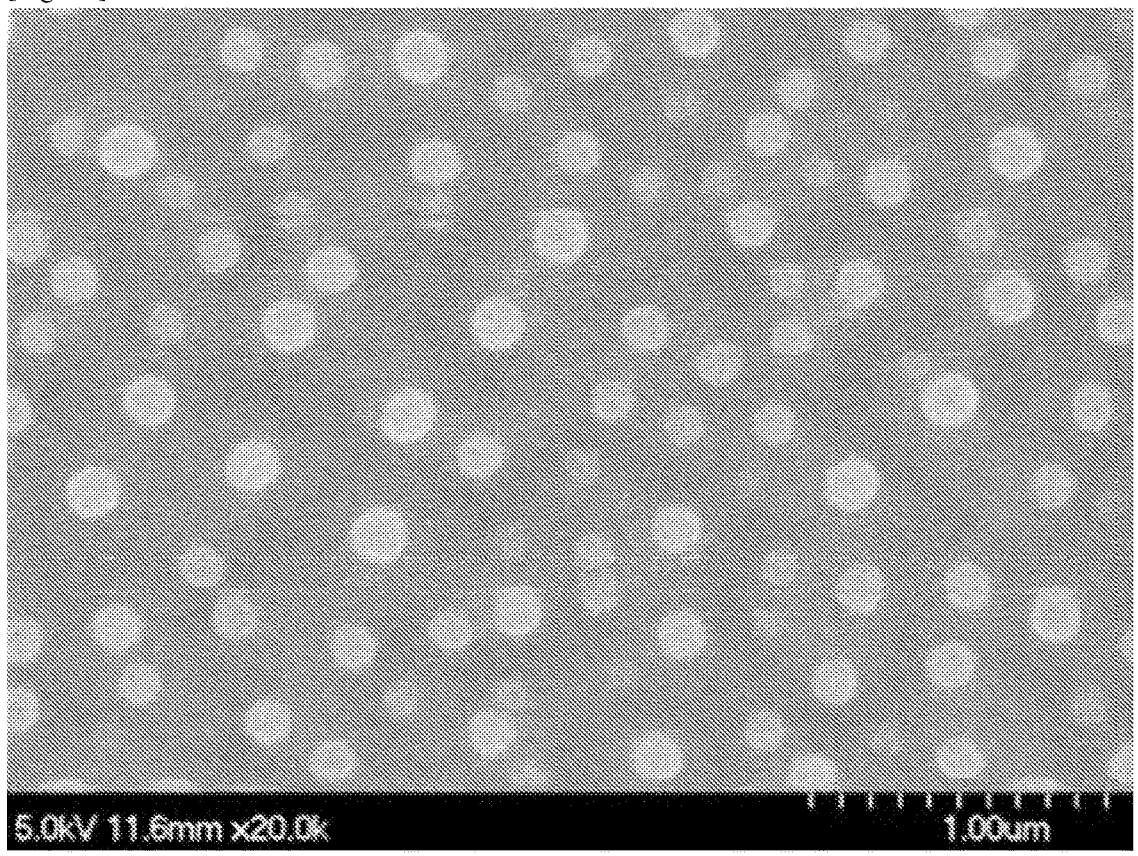
[Fig. 11]
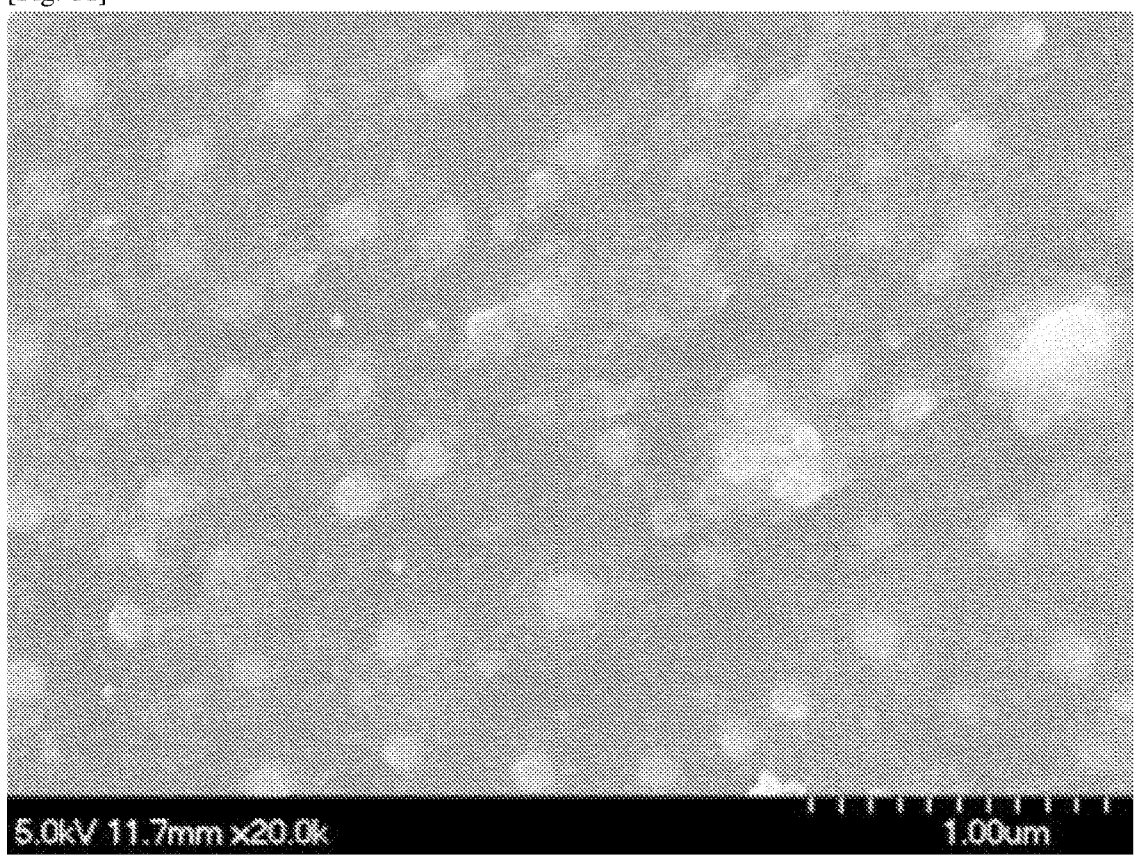

LAMINATED FILM

CROSS-REFERENCE TO RELATED PATENT APPLICATIONS

This is a National Phase of International Application No. PCT/JP2016/082783, filed Nov. 4, 2016, which claims the benefit of Japanese Application No. 2015-217014, filed Nov. 4, 2015. The entire contents of the above-referenced applications are expressly incorporated herein by reference.

TECHNICAL FIELD

The present invention relates to a laminated body in which a thin film is formed on the surface of a base material comprising a plastic material, and to a method for producing same and an apparatus for producing same. To be more specific, the present invention relates to a packaging material in which a thin film having excellent gas barrier properties is laminated on the surface of a plastic base material.

BACKGROUND ART

Plastic films are often used for packaging foodstuffs and pharmaceuticals because of their high processability and sealing properties, and attention has also focused in recent years on packaging materials for electronic devices which are susceptible to the effects of oxygen and moisture.

In order to improve the properties in terms of storing contents, various techniques are used in order to improve the gas barrier properties of plastic films. For example, use is conventionally made of a technique such as vapour deposition of aluminium or lamination, or a technique of coating or laminating a polymer material having high gas barrier properties but low processability, such as vinylidene chloride resin or ethylene-vinyl alcohol copolymer, on a material which does not have high gas barrier properties but is generally used as a packaging film material, such as polypropylene (PP), polyethylene terephthalate (PET) or polyamide (PA).

However, polymer materials having high barrier properties are costly and there is a risk of a drop in performance under high temperatures and high humidity. Furthermore, metallic materials such as aluminium are not transparent and the barrier properties thereof are reduced by damage during processing, and there are also problems in terms of recycling as a packaging material. A technique has been developed in recent years in which an inorganic thin film comprising a metal oxide such as silicon oxide or aluminium oxide is coated on a plastic film surface to form a plastic film having gas barrier properties, and this has become more widespread as a packaging material for foodstuffs and pharmaceuticals (see Patent Document 1, for example). Techniques which are able to provide packaging materials with resistance to deformation and stress during printing, processing, filling and sealing are also being developed for metal oxide thin films. Furthermore, a technique for coating a plastic film surface with an amorphous carbon thin film (diamond-like carbon (DLC) etc.) instead of a metal oxide is also being developed (see Patent Document 2, for example).

These thin films are conventionally formed by film formation using a physical vapour deposition method such as sputtering under a vacuum, ion plating or vacuum deposition, or using plasma CVD in which a chemical species is activated by means of plasma excited by a high frequency or by microwaves in order to produce reactive deposition. In either case, film formation takes place in a normal temperature region which the plastic film can withstand, so the film must be formed in a low-pressure region from a high vacuum to a medium vacuum (see Non-Patent Document 1, for example). For this reason, the film-formation apparatus requires costly equipment such as a chamber for maintaining a vacuum and a vacuum pump, and there are problems in that the running costs increase and there are problems in the difficulty of managing the equipment. In order to solve the problems caused by these vacuum processes, an atmospheric-pressure plasma CVD method in which a thin film is formed under atmospheric pressure has also been proposed (see Patent Document 3 or Patent Document 4, for example).

CITATION LIST

Patent Literature

[PTL 1] JP 11-348171 A
[PTL 2] JP 9-272567 A
[PTL 3] JP 2010-208277 A
[PTL 4] JP 2014-65281 A

Non-Patent Literature

[NPL 1] INAGAKI, TASAKA, and HIRAMATU, Journal of Applied Polymer Science, Vol. 71, 2091-2100 (1999)

SUMMARY OF INVENTION

Technical Problem

However, a thin film which is formed by means of atmospheric-pressure plasma CVD (a thin film such as DLC or silicon oxide) has a lower density than a film formed by a vacuum method and there is a deterioration in gas barrier properties for the same thickness of film, and therefore it is necessary to form a thicker film than in the case of a vacuum method, the time taken to form the film becomes longer, and there are problems in that cracking occurs and the barrier properties deteriorate due to bending stress etc. during processing, among other things. Furthermore, plasma discharge is maintained under atmospheric pressure in an atmospheric-pressure plasma CVD method, so it is necessary to apply a high-frequency pulse voltage between electrodes having a gap of around several millimetres therebetween, and a particulate compound in which the active species derived from the starting material gas re-binds is produced and deposited on the counter electrodes facing the film base material, so it is difficult to produce a stable coating film continuously.

The aim of the present invention lies in solving the abovementioned problem by inexpensively providing a thin-film laminated film having excellent barrier properties. A further aim of the present invention lies in providing a method for producing a thin-film laminated film in which a plurality of thin films are coated on a plastic film by means of atmospheric-pressure plasma CVD which has low equipment costs and running costs, and also in providing a thin-film laminated film production apparatus which is able to operate continuously for a long period of time and can produce high-speed coating.

Solution to Problem

A thin-film laminated film according to the present invention includes a plastic film, a first silicon oxide-based thin film containing silicon oxide as the main component, and a first amorphous carbon-based thin film, wherein the first amorphous carbon-based thin film is formed on the first silicon oxide-based thin film, and the first silicon oxide-based thin film has pinholes with a diameter in the range of 10-200 nm.

The thin-film laminated film according to the present invention includes a mode in which a part of the first amorphous carbon-based thin film fits into the pinholes. In addition, preferably the thin-film laminated film according to the present invention further includes a second silicon oxide-based thin film and/or a second amorphous carbon-based thin film.

The thin-film laminated film according to the present invention includes a plastic film, a first amorphous carbon-based thin film formed on one surface of the plastic film, a first silicon oxide-based thin film formed on one surface of the first amorphous carbon-based thin film, and a second amorphous carbon-based thin film formed on one surface of the first silicon oxide-based thin film, wherein the first silicon oxide-based thin film has pinholes with a diameter in the range of 10-200 nm. By employing this configuration, the adhesion of the thin-film with respect to the base material can be enhanced and it is possible to further improve the gas barrier properties. It is further possible to limit a drop in gas barrier properties when the thin-film laminated film undergoes secondary processing involving bending or deformation or the like. The thin-film laminated film according to the present invention includes a mode in which a part of the second amorphous carbon-based thin film fits into the pinholes.

In the thin-film laminated film according to the present invention, preferably the thickness of the first amorphous carbon-based thin film is 10-150 nm per layer at a location where there are no pinholes, and the thickness of the first silicon oxide-based thin film is 5-100 nm per layer at a location where there are no pinholes. By employing this configuration, it is possible to further enhance the gas barrier properties while limiting the formation of cracks in the thin film.

In the thin-film laminated film according to the present invention, the plastic film is preferably a polyester-based film or a nylon film. A polyester film is easy to use because there are various grades thereof as packaging materials, and although a nylon film has the property of reducing oxygen barrier properties at high humidity, this reduction can be limited by means of the present invention.

A method for producing a thin-film laminated film according to the present invention includes a step in which a high-frequency pulse voltage is applied under atmospheric pressure to a carbon-based starting material gas which is a mixture of a diluent gas comprising an inert gas and a hydrocarbon gas whereby the carbon-based starting material gas forms a discharge plasma, and the carbon-based starting material gas formed into a discharge plasma is brought into contact with a surface on which a film is to be formed, and a amorphous carbon-based thin film is formed on said surface, and a step in which a high-frequency pulse voltage is applied under atmospheric pressure to a metal-oxide starting material gas which is a mixture of a diluent gas comprising an inert gas, a vaporized silicon-containing organic metal compound and oxygen gas whereby the metal-oxide starting material gas forms a discharge plasma, and the metal-oxide starting material gas formed into a discharge plasma is brought into contact with a surface on which a film is to be formed, and a silicon oxide-based thin film is formed on said surface. In addition, the method for producing a thin-film laminated film according to the present invention includes a step in which a plastic film is prepared, a step in which a high-frequency pulse voltage is applied under atmospheric pressure to a carbon-based starting material gas which is a mixture of a diluent gas comprising an inert gas and a hydrocarbon gas whereby the carbon-based starting material gas forms a discharge plasma, and the carbon-based starting material gas formed into a discharge plasma is brought into contact with one surface of the plastic film to form a first amorphous carbon-based thin film, a step in which a high-frequency pulse voltage is applied under atmospheric pressure to a metal-oxide starting material gas which is a mixture of a diluent gas comprising an inert gas, a vaporized silicon-containing organic metal compound and oxygen gas whereby the metal-oxide starting material gas forms a discharge plasma, and the metal-oxide starting material gas formed into a discharge plasma is brought into contact with one surface of the first amorphous carbon-based thin film to form a first silicon oxide-based thin film, and a step in which a high-frequency pulse voltage is applied under atmospheric pressure to a carbon-based starting material gas which is a mixture of a diluent gas comprising an inert gas and a hydrocarbon gas whereby the carbon-based starting material gas forms a discharge plasma, and the carbon-based starting material gas formed into a discharge plasma is brought into contact with one surface of the first silicon oxide-based thin film to form a second amorphous carbon-based thin film.

In the method for producing a thin-film laminated film according to the present invention, the organic metal compound is preferably at least one selected from the group consisting of: trimethylsilane (TrMS), tetraethoxysilane (TEOS), tetramethoxysilane (TMOS) and hexamethyldisiloxane (HMDSO). This makes it possible to stably form the silicon oxide-based thin film.

An apparatus for producing a thin-film laminated film according to the present invention is an apparatus in which at least two thin films are laminated by means of atmospheric-pressure plasma CVD on at least one surface of a strip-shaped plastic film constituting a base material, said apparatus being characterized in that it comprises at least two chambers arranged in a line, and a high-frequency pulse power supply; each of said chambers comprises an inlet/outlet through which the strip-shaped plastic film passes back and forth inside the chambers; a first roll electrode group comprising a plurality of roll electrodes that contact a film non-formation surface of the strip-shaped plastic film on its outward path and convey the strip-shaped plastic film by rotating about the axis thereof, and a second roll electrode group comprising a plurality of roll electrodes that contact a film non-formation surface of the strip-shaped plastic film on its return path and convey the strip-shaped plastic film by rotating about the axis thereof, are disposed inside an internal space of each chamber, at positions such that the film-formation surface of the strip-shaped plastic film on its outward path and the film-formation surface of the strip-shaped plastic film on its return path are parallel with a gap therebetween, and a starting material gas nozzle for blowing out a starting material gas for forming one layer of the thin-film is also disposed therein; the plurality of roll electrodes in the first roll electrode group do not come into contact with each other and comprise a dielectric layer on a roll outer circumference; the plurality of roll electrodes in the second roll electrode group do not come into contact with each other and comprise a dielectric layer on a roll outer circumference; either of the first roll electrode group or the second roll electrode group has a high-frequency pulse voltage applied thereto from the high-frequency pulse power supply while the other is earthed, and a space between the first roll electrode group and the second roll electrode group forms a discharge space as a result of the application of the high-frequency pulse voltage; the starting material gas nozzle blows out the starting material gas towards the discharge space; and the starting material gas nozzles in the adjacent chambers provide a flow of different starting material gases.

Advantageous Effects of Invention

The thin-film laminated film according to the present invention has high gas barrier properties which are unlikely to deteriorate due to bending during processing as a packaging material or due to stress from printing etc. Furthermore, atmospheric-pressure CVD is used, and therefore it is possible to reduce the apparatus costs and running costs in comparison with a conventional vacuum process. The rate of film formation is also greater than that of a vacuum process and production costs can be considerably reduced.

BRIEF DESCRIPTION OF DRAWINGS

FIG. 1 is a schematic diagram of the apparatus for producing a thin-film laminated film according to a mode of embodiment, where (A) is an overall view and (B) is an enlargement of a roll electrode 51;

FIG. 2 is a schematic diagram of Variant Example 1 of the apparatus for producing a thin-film laminated film according to a mode of embodiment;

FIG. 3 is a schematic diagram of Variant Example 2 of the apparatus for producing a thin-film laminated film according to a mode of embodiment;

FIG. 4 is an SEM image according to Experimental Example 1, without coating;

FIG. 5 is an SEM image according to Experimental Example 3, with a coating of a 50 nm SiOx film;

FIG. 6 is an SEM image according to Experimental Example 5, with a coating of a 100 nm SiOx film;

FIG. 7 is an SEM image according to Experimental Example 7, with a coating of a 50 nm DLC film;

FIG. 8 is an SEM image according to Experimental Example 9, with a coating of a 100 nm DLC film;

FIG. 9 is an SEM image according to Experimental Example 15, with a coating of a 100 nm DLC/50 nm SiOx/100 nm DLC laminated film;

FIG. 10 is an SEM image according to Experimental Example 19, with a coating of a 100 nm DLC/100 nm SiOx/100 nm DLC laminated film; and FIG. 11 is an SEM image according to Experimental Example 33, with a coating of a 50 nm SiOx/100 nm DLC laminated film.

DESCRIPTION OF EMBODIMENTS

A mode of embodiment of the present invention will be described in detail below with reference to the drawings. It should be noted that the present invention is not limited to the mode of embodiment described below. The exemplary embodiments are merely illustrations and various modifications or improvements may be implemented in accordance with the knowledge of a person skilled in the art. It should be noted that constituent elements having the same reference symbols in the specification and the drawings denote the same components.

(Thin-Film Laminated Film)

The thin-film laminated film according to this mode of embodiment has a structure in which one layer each or a total of three or more alternating layers of a silicon oxide-based thin film comprising silicon oxide as the main component and an amorphous carbon-based thin film are laminated on at least one surface of a plastic film constituting a base material, said thin-film laminated film comprising at least one lamination unit formed by one set in which the amorphous carbon-based thin film is formed on the silicon oxide-based thin film, and the silicon oxide-based thin film has pinholes with a diameter in the range of 10-200 nm. Here, the thin-film laminated film according to this mode of embodiment includes a mode in which the amorphous carbon-based thin film formed on the silicon oxide-based thin film fits into the pinholes in the silicon oxide-based thin film.

The amorphous carbon-based thin film formed by means of atmospheric-pressure CVD does not have a large effect in terms of improving the gas barrier properties because said film is polymer-like, but said film is flexible and improves adhesion with the base material, and therefore has strong resistance to bending. Meanwhile, according to SEM observation, the silicon oxide-based thin film is formed with a large number of pinholes having a diameter of 0.01-0.2 micrometer. However, the silicon oxide-based thin film is closer to an inorganic film than the amorphous carbon-based thin film and has higher gas barrier properties excluding the pinholes. However, the silicon oxide-based thin film is dense and therefore has poor adhesion and weak resistance to bending processing. When the amorphous carbon-based thin film is coated on the silicon oxide-based thin film, the deposition takes place in such a way that the amorphous carbon fills the pinholes in the silicon oxide-based thin film, and there is a dramatic improvement in the gas barrier properties while processing damage is reduced because the amorphous carbon-based thin film is buffered.

The plastic film constituting the base material is preferably a polyester film or a nylon film. Polyester films include: polyethylene terephthalate (PET) resin, polyethylene terephthalate copolyester resin (e.g., a copolymer employing cyclohexanedimethanol instead of ethylene glycol in the polyester alcohol component), polybutylene terephthalate resin, and polyethylene naphthalate resin. Nylon films include aliphatic polyamides including nylon 6, nylon 66 and nylon 12, and polyamide films in which an aromatic polyamide aromatic dicarboxylic acid and, e.g., metaxylylenediamine, have been blended with an aliphatic polyamide. The film thickness is 12-50 micrometer, for example, and more preferably 12-20 micrometer. The film formation surface of the laminated film is one or both surfaces of the plastic film. When a film is formed on only one surface of the laminated film, it is possible to laminate a different plastic film or paper or cardboard on the surface on which a thin-film is not laminated.

The silicon oxide-based thin film comprising silicon oxide as the main component is not limited to an $SiO_2$ film, and also includes an SiOx film which is a film denoted as SiO:CH or the like, in which C and H derived from an organic silicon compound are bonded to the skeleton. Here, the silicon oxide-based thin film is not formed with pinholes when a vacuum method of film formation under a lower pressure than atmospheric pressure is used for the plasma CVD method (see FIG. 8 of Non-Patent Document 1, for example). However, when an atmospheric-pressure method is used to form the film under atmospheric pressure, the abovementioned pinholes are formed. The thin-film laminated film according to this mode of embodiment therefore solves the problem of pinholes which are produced when an atmospheric-pressure method is used. The thickness of the silicon oxide-based thin film is preferably 5-100 nm per layer at a location where there are no pinholes, and more preferably 10-50 nm. If the film thickness is less than 5 nm, it may not be possible to achieve gas barrier properties. Furthermore, if the film thickness exceeds 100 nm, cracks are likely to form.

The amorphous carbon-based thin film includes an amorphous hydrocarbon film (a-C:H) comprising a maximum of 50 at. % hydrogen atoms, which is DLC formed by an atmospheric-pressure method. The laminated thickness of the amorphous carbon-based thin film is preferably 10-150 nm per layer in a location where there are no pinholes in the silicon oxide-based thin film, and more preferably 50-100 nm. If the film thickness is less than 10 nm, it may not be possible to achieve gas barrier properties. Furthermore, if the film thickness exceeds 150 nm, cracks are likely to form. Furthermore, when lamination takes place, the thickness of the amorphous carbon-based thin film is preferably greater than the thickness of the silicon oxide-based thin film. This makes it possible to exhibit a greater effect of limiting the formation of cracks in the silicon oxide-based thin film.

The form of lamination of the silicon oxide-based thin film and the amorphous carbon-based thin film will be described next. The thin-film laminated film according to this mode of embodiment comprises at least one lamination set in which the amorphous carbon-based thin film is formed on the silicon oxide-based thin film. When one layer each of the silicon oxide-based thin film and the amorphous carbon-based thin film is laminated, the silicon oxide-based thin film is formed on the plastic film, and the amorphous carbon-based thin film is formed thereon. When a total of three alternating layers are laminated, the silicon oxide-based thin film is formed on the plastic film, the amorphous carbon-based thin film is formed thereon, and the silicon oxide-based thin film is formed on top of that, and when further layers are laminated, those thin films are laminated alternately. Furthermore, according to a different form, the amorphous carbon-based thin film is formed on the plastic film, the silicon oxide-based thin film is formed thereon, and the amorphous carbon-based thin film is formed on top of that, and when further layers are laminated, those thin films are laminated alternately. In either form, at least one lamination unit is included.

Preferably, the thin-film laminated film according to this mode of embodiment is formed on the surface of the plastic film, and a total of three or more layers of thin films are alternately laminated, with the silicon oxide-based thin film and the amorphous carbon-based thin film being formed in succession on the amorphous carbon-based thin film. By forming the amorphous carbon-based thin film on the surface of the plastic film, it is possible to achieve excellent adhesion. In addition, by laminating one or more sets of lamination units in which the pinholes in the silicon oxide-based thin film are covered by the amorphous carbon-based thin film, it is possible to achieve high gas barrier properties. The upper limit for the number of layers laminated is preferably a total of 10 layers comprising layers of the silicon oxide-based thin film and layers of the amorphous carbon-based thin film. If there are more than 10 layers, the film thickness increases and there is a risk of cracks forming in the laminated thin films, while the lamination process also becomes complex, more time is needed and there are economic drawbacks in terms of practical application. The number of layers laminated is preferably between three and five layers.

(Method for Producing the Thin-Film Laminated Film)

The method for producing the thin-film laminated film will be described next. The form of lamination of the thin-film laminated film is as described above. The following steps are each performed in order to form the amorphous carbon-based thin film or the silicon oxide-based thin film.

(Step for Forming the Amorphous Carbon-Based Thin Film)

The starting material gas which is used is a carbon-based starting material gas which is a mixture of a diluent gas comprising an inert gas and a hydrocarbon gas. An atmospheric-pressure plasma method is used, and therefore the inert gas is preferably nitrogen. The hydrocarbon gas is a mixture containing carbon, hydrogen and/or oxygen, and any one of acetylene, methane, ethane or propane, or a mixture thereof, is preferred. The concentration of hydrocarbon gas in the carbon-based starting material gas is preferably 1-10 vol % and more preferably 2-5 vol %. A high-frequency pulse voltage is applied under atmospheric pressure whereby the carbon-based starting material gas forms a discharge plasma, and the carbon-based starting material gas formed into a discharge plasma is brought into contact with a surface on which a film is to be formed, and the amorphous carbon-based thin film is formed on said surface. The pulse repeat frequency of the high-frequency pulse voltage is preferably 10-50 kHz, and more preferably 15-30 kHz. The applied high-frequency pulse voltage is preferably 5-30 kV at a 0-peak, and more preferably 7-20 kV. Furthermore, the pulse peak width is preferably 1-10 microseconds and more preferably 2-5 microseconds. The film formation time is preferably the time for the required film thickness to be achieved, but is preferably 0.5-2 seconds, for example.

(Step for Forming the Silicon Oxide-Based Thin Film)

The starting material gas which is used is a metal-oxide starting material gas which is a mixture of a diluent gas comprising an inert gas, a vaporized silicon-containing organic metal compound and oxygen gas. The inert gas is preferably nitrogen. The organic metal compound is preferably at least one selected from the group consisting of: trimethylsilane (TrMS), tetraethoxysilane (TEOS), tetramethoxysilane (TMOS) and hexamethyldisiloxane (HMDSO). The concentration of the organic metal compound in the metal-oxide starting material gas is preferably 10-200 ppm (volume ratio), and more preferably 20-100 ppm. The oxygen gas concentration in the metal-oxide starting material gas is preferably 1-10 vol %, and more preferably 2-5 vol %. The order of mixing the inert gas, organic metal compound and oxygen gas may involve mixing the three simultaneously or mixing any two to start with and then further mixing the remaining one. The preferred order in this mode of embodiment involves mixing the inert gas and the organic metal compound first of all because the organic metal compound is bubbled, and then mixing the oxygen gas therewith. TrMS is a gas at normal temperature and atmospheric pressure, and therefore the starting material gas may be obtained by mixing the inert gas and the oxygen gas in a predetermined ratio of each. A high-frequency pulse voltage is applied under atmospheric pressure whereby the metal-oxide starting material gas forms a discharge plasma, and the metal-oxide starting material gas formed into a discharge plasma is brought into contact with a surface on which a film is to be formed, and the silicon oxide-based thin film is formed on said surface. The conditions for application of the high-frequency pulse voltage are the same as the conditions when the amorphous carbon-based thin film is formed.

Either of the step for forming the amorphous carbon-based thin film or the step for forming the silicon oxide-based thin film may be performed first and the other may be performed next, whereby the thin films can be laminated. If required, these steps are repeated alternately. When these steps are repeated, the preceding thin-film formation step is carried out, after which the following thin-film formation step is preferably carried out within a time in the range of 0-60 seconds. The shorter the interval in lamination, the less adsorption of moisture etc. in the atmosphere and the better the adhesion between the thin films.

(Apparatus for Producing the Thin-Film Laminated Film)

The apparatus for producing the thin-film laminated film according to this mode of embodiment employs film formation in which at least two thin films are laminated by means of atmospheric-pressure plasma CVD on at least one surface of a strip-shaped plastic film constituting a base material. The production apparatus performs continuous film formation while the strip-shaped plastic film is conveyed, and can laminate the thin films, and has high producibility. The apparatus for producing the thin-film laminated film according to this mode of embodiment will be described with reference to FIG. 1.

FIG. 1 shows an apparatus 100 for producing the thin-film laminated film according to this mode of embodiment, where (A) is an overall view and (B) is an enlargement of a roll electrode 51. The production apparatus 100 comprises at least two chambers 7 (7A, 7B) arranged in a line, and high-frequency pulse power supplies 45, 46. In FIG. 1, the chamber 7A and the chamber 7B are disposed in series. These chambers are also arranged in series if the production apparatus 100 comprises three or more chambers 7 (not depicted). The production apparatus 100 comprises a film-formation roll 1 on which the strip-shaped plastic film constituting the base material is wound, and a roll 2 for winding the strip-shaped plastic film after film formation. The strip-shaped plastic film wound out from the roll 1 first of all passes through the inside of the chamber 7A in which the thin film of a first layer is formed, and then passes through the inside of the chamber 7B in which the thin film of a second layer is formed. After exiting the chamber 7B, the strip-shaped plastic film is turned back by means of conveyance rolls 5, 6 for turning-back and once again passes through the inside of the chamber 7B in which the thin film of a third layer is formed. The strip-shaped plastic film then once again passes through the inside of the chamber 7A in which the thin film of a fourth layer is formed. The strip-shaped plastic film then exits the chamber 7A, after which it is wound onto the roll 2. Until it reaches the conveyance rolls 5, 6 for turning-back, the strip-shaped plastic film is a plastic film 3 on its outward path, after which it becomes a plastic film 4 on its return path. The conveyance route of the plastic film 3 on its outward path is determined by conveyance rolls 21, 22, 23, 24, 25, 26. The conveyance route of the plastic film 4 is determined by conveyance rolls 27, 28, 29, 30, 31, 32. The conveyance rolls 5, 6 for turning-back pinch the plastic film therebetween. Furthermore, all of the conveyance rolls are preferably driven in synchronous rotation in such a way that the plastic film can be smoothly conveyed.

The production apparatus 100 is such that the thin film of the first layer and the thin film of the fourth layer have the same composition (referred to as the "composition A") and the thin film of the second layer and the thin film of the third layer have the same composition (referred to as the "composition B"). The resulting thin-film laminated film therefore has a three-layer structure comprising, from the bottom, the composition A/composition B/composition A on the strip-shaped plastic film.

The chamber 7A will be described in detail next. The chamber 7A comprises an inlet/outlet 12a, 12b in a partition 8 and an inlet/outlet 13a, 13b in a partition 9 in order for the strip-shaped plastic films 3, 4 to pass back and forth through the inside of the chamber 7A. The distance between the film and the ends of the inlets/outlets is preferably 0.1-0.5 mm from the point of view of the inlets/outlets not interfering with the strip-shaped plastic films 3, 4 and of minimizing the ingress and egress of gas into and out of the chamber. The ingress and egress of gas into and out of the chamber may be prevented by providing a sheet or cloth-like curtain in the inlet/outlet 13a, 13b so as to contact the plastic film. A first roll electrode group 55 comprising a plurality of roll electrodes 53, 54 that contact a film non-formation surface of the strip-shaped plastic film 3 on its outward path and convey the strip-shaped plastic film 3 by rotating about the axis thereof, and a second roll electrode group 52 comprising a plurality of roll electrodes 50, 51 that contact a film non-formation surface of the strip-shaped plastic film 4 on its return path and convey the strip-shaped plastic film 4 by rotating about the axis thereof, are disposed inside an internal space of the chamber 7A, at positions such that the film-formation surface of the strip-shaped plastic film 3 on its outward path and the film-formation surface of the strip-shaped plastic film 4 on its return path are parallel with a gap therebetween. The interval formed by the gap (the distance between the film-formation surface of the strip-shaped plastic film 3 on its outward path and the film-formation surface of the strip-shaped plastic film 4 on its return path) is preferably 1-5 mm, and especially preferably 1-3 mm. It should be noted that the interval formed by the gap may be adjusted by the mechanism for moving the roll electrodes. The plurality of roll electrodes 53, 54 in the first roll electrode group 55 are provided at an interval in such a way as not to come into contact with each other. FIG. 1 shows a mode in which there are two of the plurality of roll electrodes in the first roll electrode group 55, but there may be three or more. The plurality of roll electrodes 50, 51 in the second roll electrode group 52 are provided at an interval in such a way as not to come into contact with each other. FIG. 1 shows a mode in which there are two of the plurality of roll electrodes in the second roll electrode group 52, but there may be three or more. The plurality of roll electrodes 53, 54 in the first roll electrode group 55 and the plurality of roll electrodes 50, 51 in the second roll electrode group 52 comprise a dielectric layer on a roll outer circumference thereof. The roll electrode 51 will be described with reference to FIG. 1(B). The roll electrode 51 comprises a cylindrical electrode body 51a and a rotary shaft 51b positioned on the axis of the cylinder, and further comprises a dielectric layer 51c on the roll outer circumference of the cylindrical electrode body 51a. The other roll electrodes 50, 53, 54, 56, 57, 59, 60 are also the same. The dielectric layer 51c has a form in which a polyimide tape, fluorine-based rubber tape, or silicone rubber tape is wound on the roll outer circumference, or a form in which an insulating oxide film such as alumina is coated on the roll outer circumference, for example. The whole surface of the roll outer circumference is preferably covered by the dielectric layer. In FIG. 1, the first roll electrode group 55 is earthed. Furthermore, the second roll electrode group 52 has a high-frequency pulse voltage applied thereto from the high-frequency pulse power supply 45. It should be noted that the high-frequency pulse voltage may be applied to the first roll electrode group 55, and the second roll electrode group 52 may be earthed. The plurality of roll electrodes 53, 54 in the first roll electrode group 55 are electrically connected to each other by a conductive member which is preferably earthed. Furthermore, the plurality of roll electrodes 50, 51 in the second roll electrode group 52 are electrically connected to each other by a conductive member to which the high-frequency pulse voltage is preferably applied. The conductive member preferably conducts with the rotary shaft of the roll electrodes, for example. A space 71 between the first roll electrode group 55 and the second roll electrode group 52 forms a discharge space as a result of the application of the high-frequency pulse voltage. A starting material gas nozzle 41 for blowing out the starting material gas for forming the first layer of the thin film is further disposed in the space inside the chamber 7A. The starting material gas nozzle 41 is preferably disposed at a position in front of where the plastic film 3 on its outward path and the plastic film 4 on its return path initially pass through the space 71, as seen from the plastic film 3 on its outward path. The length of the space 71 in the film conveyance direction is 20-200 mm, for example. The starting material gas nozzle 41 blows out the starting material gas towards the discharge space (space 71). Furthermore, an exhaust port 42 is provided in the internal space of the chamber 7A at a position opposite the starting material gas nozzle 41 with the space 71 therebetween. The starting material gas that has passed through the discharge space (space 71) is expelled through the exhaust port 42.

The chamber 7B will be described in detail next. The chamber 7B comprises an inlet/outlet 14a, 14b in a partition 10 and an inlet/outlet 16a, 16b in a partition 11 in order for the strip-shaped plastic films 3, 4 to pass back and forth through the inside of the chamber 7B. The distance between the film and the ends of the inlets/outlets is preferably 0.1-0.5 mm from the point of view of the inlets/outlets not interfering with the strip-shaped plastic films 3, 4 and of minimizing the ingress and egress of gas into and out of the chamber. The ingress and egress of gas into and out of the chamber may be prevented by providing a sheet or cloth-like curtain in the inlet/outlet 14a, 14b so as to contact the plastic film. A first roll electrode group 61 comprising a plurality of roll electrodes 59, 60 that contact a film non-formation surface of the strip-shaped plastic film 3 on its outward path and convey the strip-shaped plastic film 3 by rotating about the axis thereof, and a second roll electrode group 58 comprising a plurality of roll electrodes 56, 57 that contact a film non-formation surface of the strip-shaped plastic film 4 on its return path and convey the strip-shaped plastic film 4 by rotating about the axis thereof, are disposed inside an internal space of the chamber 7B, at positions such that the film-formation surface of the strip-shaped plastic film 3 on its outward path and the film-formation surface of the strip-shaped plastic film 4 on its return path are parallel with a gap therebetween. The interval formed by the gap (the distance between the film-formation surface of the strip-shaped plastic film 3 on its outward path and the film-formation surface of the strip-shaped plastic film 4 on its return path) is preferably 1-5 mm, and especially preferably 1-3 mm. It should be noted that the interval formed by the gap may be adjusted by the mechanism for moving the roll electrodes. The plurality of roll electrodes 59, 60 in the first roll electrode group 61 are provided at an interval in such a way as not to come into contact with each other. FIG. 1 shows a mode in which there are two of the plurality of roll electrodes in the first roll electrode group 61, but there may be three or more. The plurality of roll electrodes 56, 57 in the second roll electrode group 58 are provided at an interval in such a way as not to come into contact with each other. FIG. 1 shows a mode in which there are two of the plurality of roll electrodes in the second roll electrode group 58, but there may be three or more. The plurality of roll electrodes 59, 60 in the first roll electrode group 61 and the plurality of roll electrodes 56, 57 in the second roll electrode group 58 comprise a dielectric layer on a roll outer circumference thereof (this is the same as the dielectric layer 51c of the roll electrode 51). The dielectric layer has a form in which a polyimide tape, fluorine-based rubber tape, or silicone rubber tape is wound on the roll outer circumference, or a form in which an insulating oxide film such as alumina is coated on the roll outer circumference, for example. The whole surface of the roll outer circumference is preferably covered by the dielectric layer. In FIG. 1, the first roll electrode group 61 is earthed. Furthermore, the second roll electrode group 58 has a high-frequency pulse voltage applied thereto from the high-frequency pulse power supply 46. It should be noted that the high-frequency pulse voltage may be applied to the first roll electrode group 61, and the second roll electrode group 58 may be earthed. The plurality of roll electrodes 59, 60 in the first roll electrode group 61 are electrically connected to each other by a conductive member which is preferably earthed. Furthermore, the plurality of roll electrodes 56, 57 in the second roll electrode group 58 are electrically connected to each other by a conductive member to which the high-frequency pulse voltage is preferably applied. The conductive member preferably conducts with the rotary shaft of the roll electrodes, for example. A space 72 between the first roll electrode group 61 and the second roll electrode group 58 forms a discharge space as a result of the application of the high-frequency pulse voltage. A starting material gas nozzle 43 for blowing out the starting material gas for forming the first layer of the thin film is further disposed in the space inside the chamber 7B. The starting material gas nozzle 43 is preferably disposed at a position in front of where the plastic film 3 on its outward path and the plastic film 4 on its return path initially pass through the space 72, as seen from the plastic film 3 on its outward path. The length of the space 72 in the film conveyance direction is 20-200 mm, for example. The starting material gas nozzle 43 blows out the starting material gas towards the discharge space (space 72). Furthermore, an exhaust port 44 is provided in the internal space of the chamber 7B at a position opposite the starting material gas nozzle 43 with the space 72 therebetween. The starting material gas that has passed through the discharge space (space 72) is expelled through the exhaust port 44.

A central compartment 17 bounded by the partitions 9, 10 is preferably provided between the chamber 7A and the chamber 7B. An exhaust port 15 is provided in the central compartment 17. Gas comprising the starting material gases from the chambers 7A, 7B that has leaked to the central compartment 17 from the inlets/outlets 13a, 13b, 14a, 14b is expelled from the exhaust port 15. This makes it possible to restrict mixing of the gases in the internal spaces of each of the chambers 7A, 7B.

The starting material gas nozzles 41, 43 in the adjacent chambers (7A and 7B) provide a flow of different types of starting material gases. In terms of the starting material gases, for example, the carbon-based starting material gas flows from the starting material gas nozzle 41 in the chamber 7A, while the carbon-based starting material gas flows from the starting material gas nozzle 43 in the chamber 7B and the metal-oxide starting material gas also flows therefrom. By this means, the thin-film laminated film has a three-layer structure comprising, from the bottom, the amorphous carbon-based thin film/silicon oxide-based thin film/amorphous carbon-based thin film on the strip-shaped plastic film. Furthermore, if the relationship of the types of gases is reversed, the thin-film laminated film has a three-layer structure comprising, from the bottom, the silicon oxide-based thin film/amorphous carbon-based thin film/amorphous carbon-based thin film on the strip-shaped plastic film.

A variant example of the production apparatus 100 will be described next. One chamber may be added at the location where the chamber 7A, 7B and the conveyance rolls 5, 6 for turning-back are arranged in succession, so that the arrangement is in the following order: chamber 7A, chamber 7B, chamber (not depicted; referred to hereinafter as the "chamber C"), conveyance rolls 5, 6 for turning-back. By arranging the three chambers in series and providing flows of different types of starting material gases from the starting material gas nozzles and the adjacent chambers, it is possible to increase the number of thin films laminated. For example, if a starting material gas A for forming a thin film having the composition A is used in the chamber 7A, a starting material gas B for forming a thin film having the composition B is used in the chamber 7B, and the starting material gas A is used in the chamber C1, the thin-film laminated film has a five-layer structure comprising, from the bottom, composition A thin film/composition B thin film/composition A thin film/composition B thin film/composition A thin film on the strip-shaped plastic film. In addition, one or more chambers may be added between the chamber C and the conveyance rolls 5, 6 for turning-back. This makes it possible to further increase the number of laminations.

A production apparatus 200 will be described next with reference to FIG. 2. Instead of the roll electrode groups of the production apparatus 100, the production apparatus 200 is provided with a pair of plate-shaped electrodes 152, 155. A high-frequency pulse power supply 145 is connected to a plate 152*a* of the plate-shaped electrode 152. A plate 155*a* of the plate-shaped electrode 155 is earthed. This connection relationship may be reversed. A conveyance roll 153 for smoothly introducing the plastic films 3, 4 into the space formed between the pair of plate-shaped electrodes 152, 155 is preferably disposed to the front and the rear of the plate-shaped electrodes 152, 155 in the direction of advance of the plastic films 3, 4. Dielectric layers 152*b*, 155*b* may be provided on the facing surfaces of the plates 152*a*, 155*a*, respectively. The dielectric layers 152*b*, 155*b* may be the same dielectric layers as in the production apparatus 100. In this case, the surfaces of the dielectric layers 152*b*, 155*b* preferably have a low coefficient of friction with the plastic films 3, 4 so that said plastic films 3, 4 make smooth contact therewith. Furthermore, a pair of plate-shaped electrodes 158, 161 are provided instead of the roll electrode group in the chamber 7B. The pair of plate-shaped electrodes 158, 161 preferably have the same configuration as the pair of plate-shaped electrodes 152, 155.

A production apparatus 300 will be described next with reference to FIG. 3. Instead of the roll electrode groups of the production apparatus 100, the production apparatus 300 is provided with a belt-shaped electrode group 252 in which a conductive belt 270 is wound onto belt drive rollers 250, 251. Said production apparatus is further provided with a belt-shaped electrode group 255 in which a conductive belt 271 is wound onto belt drive rollers 253, 254. The belt-shaped electrode group 252 and the belt-shaped electrode group 255 form a pair, and the belt-shaped electrode group 252 and the belt-shaped electrode group 255 are arranged in such a way that the facing surfaces of the belts 270 and 271 are parallel. The belt drive roller 251 can be rotated by means of a rotary shaft 251*a*, and the other belt drive roller also likewise has a rotary shaft. The belt drive rollers 250, 251, 253, 254 preferably have a mechanism for turning the belts 270 and 271 synchronously with conveyance of the plastic films 3, 4. The material of the belts 270, 271 is preferably a metal such as gold, silver, platinum, stainless steel, copper or iron, and the facing surfaces of the belts 270, 271 are preferably covered by dielectric layers 270*a*, 271*a*. The dielectric layers 270*a*, 271*a* are preferably dielectric sheets such as silicone rubber or heat-resistant plastic. The surface of the belt 270 opposite the surface on which the dielectric layer 270*a* is provided, i.e. the inside surface of the belt 270, is a metallic exposed surface which comes into contact with a roll-type contact 274. A high-frequency pulse power supply 245 is connected to a rotary shaft of the roll-type contact 274. The surface of the belt 271 opposite the surface on which the dielectric layer 271*a* is provided, i.e. the inside surface of the belt 271, is a metallic exposed surface which comes into contact with a roll-type contact 275. A rotary shaft of the roll-type contact 275 is earthed. It should be noted that the power input and earthing connection relationship may be reversed. Furthermore, a pair of belt-shaped electrode groups 258, 261 are provided instead of the roll electrode groups in the chamber 7B. The pair of belt-shaped electrode groups 258, 261 preferably have the same configuration as the pair of belt-shaped electrode groups 252, 255.

The rate at which the thin films are formed in the chambers is adjusted through the starting material gas supply amount, starting material gas concentration and starting material gas plasma-formation conditions etc., in such a way that the required film thickness is achieved at a predetermined film conveyance rate. Furthermore, during an experimental operation to determine the film-formation conditions, said operation is carried out under conditions such that the rate at which the thin films are formed in the chambers is constant (e.g., the DLC film-formation rate is 50 nm/second and the SiOx film-formation rate is 10 nm/second), and a film may be formed in such a way as to reach the required film thickness by adjusting the film conveyance rate. In this case, the film conveyance rate can be adjusted by turning film formation in the chambers on/off at suitable times rather than film formation being permanently on.

Example

The present invention will be described in further detail below through exemplary embodiments but the present invention is in no way limited to these exemplary embodiments.

A description will be given of an example in which a thin-film laminated film, which is the objective of the present invention, is produced using an apparatus of the type in which three chambers (the chamber 7A, the chamber 7B and the chamber C which is not depicted in FIG. 1) are arranged in series, as indicated in the variant example of the production apparatus 100. The chamber 7A is on the side of the film-formation roll 1, while the chamber C is on the side of the conveyance rolls 5, 6.

(Base Material)

A nylon film (produced by Kohjin Co., Ltd.; Bonyl RX, thickness 15 micrometer) was used as the base material and was formed into a roll shape having a width of 100 mm and a length of 10 m. Furthermore, a polyethylene terephthalate film (produced by Toray Industries, Inc.; Lumirror S10, thickness 23 micrometer) was used and was formed into a roll shape having a width of 100 mm and a length of 10 m.

The experimental conditions of the experimental examples are shown in table 1a, table 1b table 1c and table 1d. It should be noted that the gap formed by the discharge spaces (spaces 71, 72) was 2 mm in all the chambers. The discharge plasma was formed under conditions of normal pressure at 95 kPa (0.095 MPa), and the pressures inside the chambers (including the pressure in the discharge spaces (spaces 71, 72)) were also kept the same. The high-frequency voltage was applied under conditions of a negative peak voltage of 18 kV and with a peak width at 20 kHz of 10 microseconds. Furthermore, the normal-pressure conditions were set inside the chambers by substitution with nitrogen gas at a pressure of 95 kPa. The roll electrodes were made of copper and the dielectric layer wound on the roll outer circumference was a silicone rubber tape. The interval in the space where plasma was generated by the facing roll electrodes was 20 mm in the direction of advance of the film.

The metal-oxide starting material gas in the chamber B was prepared as follows.

(Use of TrMS)

A starting material gas obtained by mixing a diluent gas comprising nitrogen gas, TrMS and oxygen gas was introduced to the starting material gas nozzle 43.

(Use of HMDSO)

A starting material gas, obtained by mixing a diluent gas comprising nitrogen gas and HMDSO in a vapour generator (evaporator) to form a precursor mixture in the form of a vapour which was then mixed with oxygen gas, was introduced to the starting material gas nozzle 43.

The starting material gas nozzle comprised a slit-shaped gas introduction portion and the width was the same as that of the discharge spaces (spaces 71, 72). The exhaust port comprised a slit-shaped suction port and the width was the same as that of the discharge spaces (spaces 71, 72).

The film conveyance rate was adjusted each time in order to achieve a predetermined film thickness for each laminated layer. The film-formation rate of the amorphous carbon-based thin film (denoted as a DLC thin film) under the conditions of these experiments was 50 nm/second, and the film-formation rate of the silicon oxide-based thin film (denoted as an SiOx thin film) was 10 nm/second, and therefore the time of movement over the distance of 20 mm in the plasma generation space was adjusted according to the conveyance time in order to control the thickness of each layer. Moreover, as mentioned above, it is possible to control the thickness of each layer by changing the distance of the plasma generation space when the conveyance speed is constant in the actual apparatus used.

Films were formed as follows in Experimental Examples 33 and 34. That is to say, a film was not formed in the chamber 7A, rather a film was formed by passage through the chamber 7B and a film was further formed by passage through the chamber 7C, after which the return path involved winding without a film being formed in either the chamber 7B or the chamber 7A.

(OTR)

The oxygen transmission coefficient (oxygen transmission rate: OTR) was measured using an oxygen transmission rate measurement apparatus (produced by Mocon, Inc.; model OX-TRAN 2/20).

(Film Thickness)

The film thickness was measured using a stylus surface profilometer (Dektak 3030, produced by Veeco Instruments, Inc., USA).

TABLE 1a

| | | Chamber 7A | | | | Chamber 7B | | | |
|---|---|---|---|---|---|---|---|---|---|
| Experimental Example | Base material film Resin type/ thickness (μm) | Starting material gas/flow rate (L/minute) | Nitrogen gas flow rate (L/minute) | High-frequency pulse voltage (kV)/frequency (kHz)/peak width (μsec) | Starting material gas/flow rate | Oxygen gas flow rate (L/minute) | Nitrogen gas flow rate (L/minute) | High-frequency pulse voltage (kV)/frequency (kHz)/peak width (μsec) |
| 1 | Reference Example | PA/15 | — | — | — | — | — | — | — |
| 2 | Reference Example | PA/15 | — | — | — | — | — | — | — |
| 3 | Comparative Example | PA/15 | — | — | — | TrMS/0.5 ml/minutes | 0.5 | 20 | 18/20/10 |
| 4 | Comparative Example | PA/15 | — | — | — | TrMS/0.5 ml/minutes | 0.5 | 20 | 18/20/10 |
| 5 | Comparative Example | PA/15 | — | — | — | TrMS/0.5 ml/minutes | 0.5 | 20 | 18/20/10 |
| 6 | Comparative Example | PA/15 | — | — | — | TrMS/0.5 ml/minutes | 0.5 | 20 | 18/20/10 |
| 7 | Comparative Example | PA/15 | Acetylene/1 | — | — | — | — | — | — |
| 8 | Comparative Example | PA/15 | Acetylene/1 | 5 | 18/20/10 | — | — | — | — |
| 9 | Comparative Example | PA/15 | Acetylene/1 | 5 | 18/20/10 | — | — | — | — |
| 10 | Comparative Example | PA/15 | Acetylene/1 | 5 | 18/20/10 | — | — | — | — |

| Chamber C | |
|---|---|
| High-frequency pulse | Thin-film layer configuration |

TABLE 1a-continued

| Experimental Example | Starting material gas/flow rate (L/minute) | Nitrogen gas flow rate (L/minute) | voltage (kV)/frequency (kHz)/peak width (μsec) | Synthesis pressure (kPa) | Material/thickness (nm) (given from the bottom layer towards the top layer) | Relative humidity (% RH) | OTR (cc/m²/ 24 h/atm) |
|---|---|---|---|---|---|---|---|
| 1 | — | — | — | — | Base material film (no film/control) | 50 | 39 |
| 2 | — | — | — | — | | 90 | 135 |
| 3 | — | — | — | 95 | SiOx50 | 50 | 15.5 |
| 4 | — | — | — | 95 | | 90 | 66 |
| 5 | — | — | — | 95 | SiOx100 | 50 | 5.2 |
| 6 | — | — | — | 95 | | 90 | 36 |
| 7 | — | — | — | 95 | DLC50 | 50 | 40 |
| 8 | — | — | — | 95 | | 90 | 135 |
| 9 | — | — | — | 95 | DLC100 | 50 | 38 |
| 10 | — | — | — | 95 | | 90 | 130 |

TABLE 1b

| | | | Chamber 7A | | | Chamber 7B | | |
|---|---|---|---|---|---|---|---|---|
| Experimental Example | Base material film Resin type/ thickness (μm) | Starting material gas/flow rate (L/minute) | Nitrogen gas flow rate (L/ minute) | High-frequency pulse voltage (kV)/frequency (kHz)/peak width (μsec) | Starting material gas/flow rate | Oxygen gas flow rate (L/minute) | Nitrogen gas flow rate (L/minute | High-frequency pulse voltage (kV)/frequency (kHz)/peak width (μsec) |
| 11 | Comparative Example PA/15 | Acetylene/1 | 5 | 18/20/10 | — | — | — | — |
| 12 | Comparative Example PA/15 | Acetylene/1 | 5 | 18/20/10 | — | — | — | — |
| 13 | Comparative Example PA/15 | Acetylene/1 | 5 | 18/20/10 | — | — | — | — |
| 14 | Comparative Example PA/15 | Acetylene/1 | 5 | 18/20/10 | — | — | — | — |
| 15 | Exemplary Embodiment PA/15 | Acetylene/1 | 5 | 18/20/10 | TrMS/0.5 ml/ minutes | 0.5 | 20 | 18/20/10 |
| 16 | Exemplary Embodiment PA/15 | Acetylene/1 | 5 | 18/20/10 | TrMS/0.5 ml/ minutes | 0.5 | 20 | 18/20/10 |
| 17 | Exemplary Embodiment PA/15 | Acetylene/1 | 5 | 18/20/10 | TrMS/0.5 ml/ minutes | 0.5 | 20 | 18/20/10 |
| 18 | Exemplary Embodiment PA/15 | Acetylene/1 | 5 | 18/20/10 | TrMS/0.5 ml/ minutes | 0.5 | 20 | 18/20/10 |

| | Chamber C | | | | | | |
|---|---|---|---|---|---|---|---|
| Experimental Example | Starting material gas/flow rate (L/minute) | Nitrogen gas flow rate (L/minute) | High-frequency pulse voltage (kV)/frequency (kHz)/peak width (μsec) | Synthesis pressure (kPa) | Thin-film layer configuration Material/thickness (nm) (given from the bottom layer towards the top layer) | Relative humidity (% RH) | OTR (cc/m²/ 24 h/atm) |
| 11 | — | — | — | 95 | DLC150 | 50 | 38 |
| 12 | — | — | — | 95 | | 90 | 130 |
| 13 | — | — | — | 95 | DLC200 | 50 | 38 |
| 14 | — | — | — | 95 | | 90 | 127 |
| 15 | — | — | — | 95 | DLC100/SiOx50/ DLC100 | 50 | 3 |
| 16 | — | — | — | 95 | | 90 | 16 |
| 17 | Acetylene/1 | 5 | 18/20/10 | 95 | DLC100/SiOx50/ DLC100/SiOx50/ DLC100 | 50 | 2 |
| 18 | Acetylene/1 | 5 | 18/20/10 | 95 | | 90 | 12 |

TABLE 1c

| Experimental Example | | Base material film Resin type/ thickness (μm) | Chamber 7A | | | Chamber 7B | | | |
|---|---|---|---|---|---|---|---|---|---|
| | | | Starting material gas/flow rate (L/minute) | Nitrogen gas flow rate (L/minute) | High-frequency pulse voltage (kV)/frequency (kHz)/peak width (μsec) | Starting material gas/flow rate | Oxygen gas flow rate (L/minute) | Nitrogen gas flow rate (L/minute) | High-frequency pulse voltage (kV)/frequency (kHz)/peak width (μsec) |
| 19 | Exemplary Embodiment | PA/15 | Acetylene/1 | 5 | 18/20/10 | TrMS/0.5 ml/minutes | 0.5 | 20 | 18/20/10 |
| 20 | Exemplary Embodiment | PA/15 | Acetylene/1 | 5 | 18/20/10 | TrMS/0.5 ml/minutes | 0.5 | 20 | 18/20/10 |
| 21 | Exemplary Embodiment | PA/15 | Acetylene/1 | 5 | 18/20/10 | TrMS/0.5 ml/minutes | 0.5 | 20 | 18/20/10 |
| 22 | Exemplary Embodiment | PA/15 | Acetylene/1 | 5 | 18/20/10 | TrMS/0.5 ml/minutes | 0.5 | 20 | 18/20/10 |
| 23 | Exemplary Embodiment | PA/15 | Acetylene/1 | 5 | 18/20/10 | TrMS/0.5 ml/minutes | 0.5 | 20 | 18/20/10 |
| 24 | Exemplary Embodiment | PA/15 | Acetylene/1 | 5 | 18/20/10 | TrMS/0.5 ml/minutes | 0.5 | 20 | 18/20/10 |
| 25 | Exemplary Embodiment | PA/15 | Methane/0.5 | 5 | 14/20/10 | TrMS/0.5 ml/minutes | 0.5 | 20 | 14/20/10 |
| 26 | Exemplary Embodiment | PA/15 | Methane/0.5 | 5 | 14/20/10 | TrMS/0.5 ml/minutes | 0.5 | 20 | 14/20/10 |

| Experimental Example | Chamber C | | | | Synthesis pressure (kPa) | Thin-film layer configuration Material/thickness (nm) (given from the bottom layer towards the top layer) | Relative humidity (% RH) | OTR (cc/m²/24 h/atm) |
|---|---|---|---|---|---|---|---|---|
| | Starting material gas/flow rate (L/minute) | Nitrogen gas flow rate (L/minute) | High-frequency pulse voltage (kV)/frequency (kHz)/peak width (μsec) | | | | | |
| 19 | — | — | — | | 95 | DLC100/SiOx100/DLC100 | 50 | 5 |
| 20 | — | — | — | | 95 | | 90 | 18 |
| 21 | — | — | — | | 95 | DLC150/SiOx50/DLC150 | 50 | 1 |
| 22 | — | — | — | | 95 | | 90 | 4 |
| 23 | Acetylene/1 | 5 | 18/20/10 | | 95 | DLC150/SiOx50/DLC150/SiOx50/ | 50 | 1 |
| 24 | Acetylene/1 | 5 | 18/20/10 | | 95 | DLC150 | 90 | 1 |
| 25 | — | — | — | | 95 | DLC50/SiOx50/DLC50 | 50 | 15 |
| 26 | — | — | — | | 95 | | 90 | 48 |

TABLE 1d

| Experimental Example | | Base material film Resin type/ thickness (μm) | Chamber 7A | | | Chamber 7B | | | |
|---|---|---|---|---|---|---|---|---|---|
| | | | Starting material gas/flow rate (L/minute) | Nitrogen gas flow rate (L/minute) | High-frequency pulse voltage (kV)/frequency (kHz)/peak width (μsec) | Starting material gas/flow rate | Oxygen gas flow rate (L/minute) | Nitrogen gas flow rate (L/minute) | High-frequency pulse voltage (kV)/frequency (kHz)/peak width (μsec) |
| 27 | Exemplary Embodiment | PA/15 | Acetylene/1 | 5 | 14/20/10 | TrMS/0.02 g/minutes | 0.5 | 20 | 14/20/10 |
| 28 | Exemplary Embodiment | PA/15 | Acetylene/1 | 5 | 14/20/10 | TrMS/0.02 g/minutes | 0.5 | 20 | 14/20/10 |
| 29 | Reference Example | PET/23 | Acetylene/1 | — | — | — | — | — | — |
| 30 | Reference Example | PET/23 | Acetylene/1 | — | — | — | — | — | — |
| 31 | Exemplary | PET/23 | Acetylene/1 | 5 | 14/20/10 | TrMS/0.02 g/ | 0.5 | 20 | 14/20/10 |

TABLE 1d-continued

| | | | | | | | | | |
|---|---|---|---|---|---|---|---|---|---|
| 32 | Embodiment Exemplary Embodiment | PET/23 | Acetylene/1 | 5 | 14/20/10 | TrMS/0.02 g/ minutes | 0.5 | 20 | 14/20/10 |
| 33 | Exemplary Embodiment | PA/15 | — | — | — | TrMS/0.5 ml/ minutes | 0.5 | 20 | 18/20/10 |
| 34 | Exemplary Embodiment | PA/15 | — | — | — | TrMS/0.5 ml/ minutes | 0.5 | 20 | 18/20/10 |

| Experimental Example | Chamber C | | | | | | |
|---|---|---|---|---|---|---|---|
| | Starting material gas/flow rate (L/minute) | Nitrogen gas flow rate (L/minute) | High-frequency pulse voltage (kV)/frequency (kHz)/peak width (μsec) | Synthesis pressure (kPa) | Thin-film layer configuration Material/thickness (nm) (given from the bottom layer towards the top layer) | Relative humidity (% RH) | OTR (cc/m²/ 24 h/atm) |
| 27 | — | — | — | 95 | DLC100/SiOx50/DLC100 | 50 | 12 |
| 28 | — | — | — | 95 | | 90 | 38 |
| 29 | — | — | — | — | Base material film (no film/control) | 50 | 50 |
| 30 | — | — | — | — | | 90 | 52 |
| 31 | — | — | — | 95 | DLC100/SiOx50/DLC100 | 50 | 20 |
| 32 | — | — | — | 95 | | 90 | 21 |
| 33 | Acetylene/1 | 5 | 18/20/10 | 95 | SiOx50/DLC100 (Note 1) | 50 | 6 |
| 34 | Acetylene/1 | 5 | 18/20/10 | 95 | | 90 | 29 |

PA: Kohjin, Bonyl RX, thickness 15 micrometer
TrMS: Trimethylsilane
HMDSO: Hexamethyldisiloxane
PET: Toray, Lumirror S10, thickness 23 micrometer
(Note 1) A film was not formed in the chamber 7A; a film was formed by passage through the chamber 7B and a film was further formed by passage through the chamber 7C, after which the return path involved winding without a film being formed in either the chamber 7B or the chamber 7A.

The experimental conditions, resulting thin-film layer configuration and OTR measurement results were collated for Experimental Examples 1-34. Furthermore, FIG. 4-FIG. 11 show images from surface observation by means of a scanning electron microscope. FIG. 4 is an SEM image according to Experimental Example 1 where the base material was uncoated. FIG. 5 is an SEM image according to Experimental Example 3, with a coating of a 50 nm SiOx film. FIG. 6 is an SEM image according to Experimental Example 5, with a coating of a 100 nm SiOx film. FIG. 7 is an SEM image according to Experimental Example 7, with a coating of a 50 nm DLC film. FIG. 8 is an SEM image according to Experimental Example 9, with a coating of a 100 nm DLC film. FIG. 9 is an SEM image according to Experimental Example 15, with a coating of a 100 nm DLC/50 nm SiOx/100 nm DLC laminated film. FIG. 10 is an SEM image according to Experimental Example 19, with a coating of a 100 nm DLC/100 nm SiOx/100 nm DLC laminated film. FIG. 11 is an SEM image according to Experimental Example 33, with a coating of a 50 nm SiOx/100 nm DLC laminated film.

Referring to FIG. 5 and FIG. 6, a large number of pinholes having a diameter of 10-200 nm were produced in the SiOx film formed on the base material. In contrast to this, referring to FIG. 7 and FIG. 8, pinhole formation was not apparent in the DLC film formed on the base material, and the surface was smooth. In addition, referring to FIG. 9 and FIG. 10, white dot-like bodies were observed in the thin film having a three-layer structure comprising DLC/SiOx/DLC formed on the base material. Furthermore, referring to FIG. 11, the same white dot-like bodies as in the three-layer structure were observed in the thin film having a two-layer structure comprising SiOx/DLC formed on the base material.

The white dot-like regions in FIG. 9 and FIG. 10 could be confirmed as being traces from the pinholes formed in the SiOx thin film formed on the DLC thin film being filled by the DLC thin film formed on top. The DLC thin film was also formed in the regions of the SiOx thin film where there were no pinholes. It could also be confirmed that the DLC thin film formed on the SiOx thin film fitted into the pinholes in the SiOx thin film. It could be confirmed from FIG. 11 that the pinholes in the SiOx thin film were filled even when only the DLC thin film was formed on the SiOx thin film.

The rate of improvement of the oxygen transmission rate (OTR) was compared for the gas barrier properties. For example, when a polyamide film having a thickness of 15 micrometer (39 cc/day/m²/atm, 50% RH, 135 cc/day/m²/atm, 90% RH) was used as the base material, the OTR was 15.5 cc/day/m²/atm, 50% RH, 66 cc/day/m²/atm, 90% RH in the case of an SiOx coating formed by means of atmospheric-pressure CVD having a film thickness of 50 nm (Experimental Examples 3 and 4). In the case of a DLC coating formed by means of atmospheric-pressure CVD having a film thickness of 100 nm (Experimental Examples 9 and 10), the values were 38 cc/day/m²/atm, 50% RH, 130 cc/day/m²/atm, 90% RH. However, when the lamination configuration comprised three layers, namely DLC 100 nm/SiOx 50 nm/DLC 100 nm (Experimental Examples 15 and 16), the values decreased to 6 cc/day/m²/atm, 50% RH, 18 cc/day/m²/atm, 90% RH. In addition, when the configuration was DLC 100 nm/SiOx 50 nm/DLC 100 nm/SiOx 50 nm/DLC 100 nm (Experimental Examples 17 and 18), the values decreased to 2.5 cc/day/m²/atm, 50% RH, 12 cc/day/m²/atm, 90% RH. Furthermore, the values still dropped to 6 cc/day/m²/atm, 50% RH, 29 cc/day/m²/atm, 90% RH in the case of a two-layer structure such as SiOx 50 nm/DLC 100 nm (Experimental Examples 33 and 34). In addition, when the humidity conditions were changed from 50% RH to 90% RH, there was a marked increase in the OTR in a polyamide film, but an effect of reducing the increase in OTR was apparent in laminated films comprising two layers, three layers or five layers.

The reason for this is that a DLC layer formed by means of atmospheric-pressure CVD does not have a large effect in terms of improving the gas barrier properties because said film is polymer-like, but said film is flexible and improves adhesion with the base material, and therefore has strong resistance to bending; meanwhile, according to SEM observation, the SiOx film is formed with a large number of pinholes of 10-200 nm, but said film is closer to an inorganic film than the DLC thin film and has higher gas barrier properties excluding the pinholes (from a comparison of Experimental Examples 3 and 7). However, the SiOx film is dense and therefore has poor adhesion and weak resistance to bending processing. When the DLC film is coated on the SiOx film, it is believed that the deposition takes place in such a way that the DLC fills the pinholes in the SiOx film, and there is a dramatic improvement in the gas barrier properties while processing damage is reduced because the DLC film is buffered. Furthermore, the DLC film is coated on the base material first of all, and therefore said DLC film provides a buffer to deformation produced in the base material as a result of moisture absorption and stress, and since it also has good adhesion with the SiOx film, this is believed to be effective for preventing the phenomenon of cracking when the SiOx film is subjected to deformation.

REFERENCE SIGNS LIST

100, 200, 300 . . . Apparatus for producing thin-film laminated film
1 . . . Film-formation roll on which strip-shaped plastic film is wound before film formation
2 . . . Roll for winding strip-shaped plastic film after film formation
3 . . . Plastic film on outward path
4 . . . Plastic film on return path
5, 6 . . . Conveyance roll for turning-back
7 (7A, 7B) . . . Chamber
8, 9, 10, 11 . . . Partition
12a, 12b, 13a, 13b, 14a, 14b, 16a, 16b . . . Inlet/outlet
17 . . . Central compartment
15, 42, 44 . . . Exhaust port
21, 22, 23, 24, 25, 26, 27, 28, 29, 30, 31, 32, 153, 154 . . . Conveyance roll
41, 43 . . . Starting material gas nozzle
45, 46, 145, 146, 245, 246 . . . High-frequency pulse power supply
50, 51, 53, 54, 56, 57, 59, 60 . . . Roll electrode
51a . . . Cylindrical electrode body
51b, 251a . . . Rotary shaft
51c . . . Dielectric layer
55, 61 . . . First roll electrode group
52, 58 . . . Second roll electrode group
71, 72 . . . Discharge space (space)
152, 155, 158, 161 . . . Plate-shaped electrode
152a, 155a, 158a, 161a . . . Plate
152b, 155b, 158b, 161b . . . Dielectric layer
250, 251, 253, 254, 256, 257, 259, 260 . . . Belt drive roller
252, 255, 258, 261 . . . Belt-shaped electrode group
270, 271, 272, 273 . . . Belt
270a, 271a, 272a, 273a . . . Dielectric layer
274, 275, 276, 277 . . . Roll-type contact

The invention claimed is:

1. A thin-film laminated film comprising:
a plastic film;
a first amorphous carbon-based thin film formed on one surface of the plastic film;
a first silicon oxide-based thin film formed on one surface of the first amorphous carbon-based thin film; and
a second amorphous carbon-based thin film formed on one surface of the first silicon oxide-based thin film,
wherein the first silicon oxide-based thin film has pinholes formed by atmospheric-pressure plasma CVD such that the pinholes have diameters of between 10 nm and 200 nm.

2. The thin-film laminated film according to claim 1, wherein a part of the second amorphous carbon-based thin film fits into the pinholes.

3. The thin-film laminated film according to claim 1, wherein
a thickness of the first amorphous carbon-based thin film is between 10 nm and 150 nm at a location having no pinholes, and
a thickness of the first silicon oxide-based thin film is between 5 nm and 100 nm at a location having no pinholes.

4. The thin-film laminated film according to claim 1, wherein the plastic film is at least one of a polyester-based film or a nylon film.

5. The thin-film laminated film according to claim 1, wherein
the first amorphous carbon-based thin film and the second amorphous carbon-based thin film are formed by atmospheric-pressure plasma CVD, and
a part of the second amorphous carbon-based thin film that is formed by atmospheric-pressure plasma CVD fits into the pinholes of the first silicon oxide-based thin film that are formed by atmospheric-pressure plasma CVD.

* * * * *